(12) United States Patent
Shen

(10) Patent No.: US 11,876,346 B2
(45) Date of Patent: Jan. 16, 2024

(54) CONTINUOUS WAVE LASER DRIVER WITH ENERGY RECYCLING

(71) Applicant: Analog Devices, Inc., Norwood, MA (US)

(72) Inventor: Junhua Shen, Wilmington, MA (US)

(73) Assignee: Analog Devices, Inc., Norwood, MA (US)

(*) Notice: Subject to any disclaimer, the term of this patent is extended or adjusted under 35 U.S.C. 154(b) by 1075 days.

(21) Appl. No.: 16/453,706

(22) Filed: Jun. 26, 2019

(65) Prior Publication Data

US 2020/0412087 A1    Dec. 31, 2020

(51) Int. Cl.
| | |
|---|---|
| G01S 17/00 | (2020.01) |
| H01S 5/042 | (2006.01) |
| G01S 17/10 | (2020.01) |
| G01S 7/484 | (2006.01) |

(52) U.S. Cl.
CPC ............ *H01S 5/0428* (2013.01); *G01S 7/484* (2013.01); *G01S 17/10* (2013.01)

(58) Field of Classification Search
USPC ........................................................ 356/5.01
See application file for complete search history.

(56) References Cited

U.S. PATENT DOCUMENTS

| | | | |
|---|---|---|---|
| 5,736,881 A | 4/1998 | Ortiz | |
| 5,936,599 A | 8/1999 | Reymond | |
| 5,940,421 A * | 8/1999 | Partlo | G03F 7/70575 |
| | | | 372/38.09 |
| 6,184,662 B1 | 2/2001 | Yabuuchi et al. | |
| 6,697,402 B2 | 2/2004 | Crawford | |
| 7,638,954 B2 | 12/2009 | Kunimatsu et al. | |
| 8,680,781 B1 | 3/2014 | Pflaum | |
| 9,054,491 B1 * | 6/2015 | Hurlbut | H01S 5/1071 |
| 9,155,146 B2 | 10/2015 | Lee et al. | |
| 9,161,401 B1 | 10/2015 | Melanson et al. | |

(Continued)

FOREIGN PATENT DOCUMENTS

| | | |
|---|---|---|
| CN | 101965078 B | 9/2013 |
| CN | 105515391 A * | 4/2016 |

(Continued)

OTHER PUBLICATIONS

"Illumination Driving for Time-of-Flight (ToF) Camera System", Texas Instruments Application Report SBAA209A, (Aug. 2016), 17 pgs.

(Continued)

*Primary Examiner* — James R Hulka
(74) *Attorney, Agent, or Firm* — Schwegman Lundberg & Woessner, P.A.

(57) ABSTRACT

A laser pulse emitter circuit comprises a laser diode and a laser diode driver circuit. The laser diode driver circuit includes an inductive circuit element in series with the laser diode, at least one capacitive circuit element connected in series with the inductive circuit element, and a switch circuit configured to activate the laser diode using duty cycling that includes an on-period and an off-period, wherein energy used in an activation of the laser diode is stored in the inductive circuit element and the at least one capacitive circuit element, and the stored energy is recycled by use in a subsequent activation of the laser diode.

18 Claims, 8 Drawing Sheets

(56) References Cited

U.S. PATENT DOCUMENTS

| | | | |
|---|---|---|---|
| 9,368,936 B1 | 6/2016 | Lenius et al. | |
| 9,755,636 B2* | 9/2017 | Wyland | H03K 17/04123 |
| 9,847,736 B2 | 12/2017 | Grootjans et al. | |
| 10,158,211 B2 | 12/2018 | Barnes et al. | |
| 10,205,381 B1* | 2/2019 | Vinciarelli | H02M 3/158 |
| 10,511,142 B2* | 12/2019 | Crawford | H02M 3/156 |
| 10,673,204 B2* | 6/2020 | Pavlov | G01S 7/4816 |
| 2003/0016711 A1* | 1/2003 | Crawford | H01S 5/042 |
| | | | 372/38.02 |
| 2004/0030230 A1* | 2/2004 | Norris | A61B 5/14552 |
| | | | 600/323 |
| 2004/0165403 A1* | 8/2004 | Crawford | H02M 1/4208 |
| | | | 363/17 |
| 2006/0244339 A1* | 11/2006 | Mazz | H04N 9/3129 |
| | | | 310/317 |
| 2007/0014916 A1* | 1/2007 | Daniels | H01L 27/3209 |
| | | | 427/66 |
| 2007/0170874 A1* | 7/2007 | Kunimatsu | H05B 45/3725 |
| | | | 315/291 |
| 2014/0070714 A1* | 3/2014 | Lee | H05B 45/46 |
| | | | 315/186 |
| 2014/0070727 A1* | 3/2014 | Pflaum | H05B 45/375 |
| | | | 315/307 |
| 2014/0211192 A1* | 7/2014 | Grootjans | H02M 7/42 |
| | | | 356/5.01 |
| 2015/0271882 A1* | 9/2015 | Melanson | H05B 39/047 |
| | | | 315/186 |
| 2016/0341664 A1* | 11/2016 | Rothberg | H01L 27/14603 |
| 2016/0344156 A1* | 11/2016 | Rothberg | H01S 3/1305 |
| 2017/0085057 A1* | 3/2017 | Barnes | H01S 5/0428 |
| 2017/0366181 A1* | 12/2017 | Wyland | H03K 17/6877 |
| 2018/0261975 A1 | 9/2018 | Pavlov et al. | |
| 2018/0278011 A1 | 9/2018 | Galvano et al. | |
| 2018/0323576 A1 | 11/2018 | Crawford et al. | |
| 2019/0249240 A1* | 8/2019 | Rothberg | C12Q 1/6869 |
| 2020/0359480 A1* | 11/2020 | Magoz | G02B 27/0093 |
| 2021/0111533 A1* | 4/2021 | Mousavian | H01S 5/4025 |

FOREIGN PATENT DOCUMENTS

| | | | | |
|---|---|---|---|---|
| DE | 102004060577 B4 * | 8/2010 | | H04B 13/02 |
| DE | 102006036167 B4 | 2/2011 | | |
| JP | 2004134740 A * | 4/2004 | | G11B 7/0062 |

OTHER PUBLICATIONS

"Time-of-flight (ToF) measurement using pulse lasers", OSRAM Opto Semiconductors Application Note No. AN106, (Nov. 15, 2018), 22 pgs.

* cited by examiner

CONTINUOUS WAVE LASER DRIVER WITH ENERGY RECYCLING

FIELD OF THE DISCLOSURE

This document relates generally to electronic circuits for optical applications, and in particular it relates to electronic circuits that include a laser emitting diode.

BACKGROUND

Time-of-flight (ToF) is one technique for depth imaging, which has a wide range of applications including augmented reality, machine vision, facial identification (face ID), industrial automation, and autonomous vehicles. A ToF sensor mainly consists of a laser emitter and a laser receiver. The ToF sensor determines the time from when the laser emitter sends out a light pulse to when the reflected pulse from an object is received. Distance to the object or depth to the object can be determined using the determined time and the speed of light. To get sufficient reflection from the object to determine the time measurements, the laser energy is emitted with a high energy requiring a high amount of power to drive the laser emitter. This can limit the applications for which a ToF sensor can be used.

SUMMARY OF THE DISCLOSURE

This document relates generally to driver circuits for laser diodes and methods of their operation. A laser pulse emitter circuit according to various aspects includes a laser diode and a laser diode driver circuit. The laser diode driver circuit includes an inductive circuit element in series with the laser diode, at least one capacitive circuit element connected in series with the inductive circuit element, and a switch circuit configured to activate the laser diode using duty cycling that includes an on-period and an off-period. Energy used in an activation of the laser diode includes energy stored in the inductive circuit element and the at least one capacitive circuit element, and the stored energy is recycled by use in a subsequent activation of the laser diode.

A time of flight sensor circuit according to various aspects includes an emitter circuit and a receiver circuit. The emitter circuit includes a laser diode and a laser diode driver circuit. The laser diode driver circuit includes an inductive circuit element in series with the laser diode, at least one capacitive circuit element connected in series with the inductive circuit element, and a switch circuit configured to activate the laser diode using duty cycling that includes an on-period and an off-period, wherein energy used in an activation of the laser diode includes energy stored in the inductive circuit element and the at least one capacitive circuit element, and the stored energy is recycled by use in a subsequent activation of the laser diode. The receiver circuit includes a photodiode or array of photodiodes configured to receive laser energy emitted by the laser diode and reflected back toward the time of flight sensor circuit.

A method of operating a time of flight sensor according to various aspects includes activating a laser emitting diode of the time of flight sensor using duty cycling that turns the laser emitting diode on and off, detecting reflected laser energy emitted by the laser emitting diode using a photodiode of the time of flight sensing circuit, storing activation energy from an on-period of the duty cycling in an inductive circuit element of the laser emitting circuit, and recycling the stored activation energy to activate the laser diode in a subsequent on-period.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
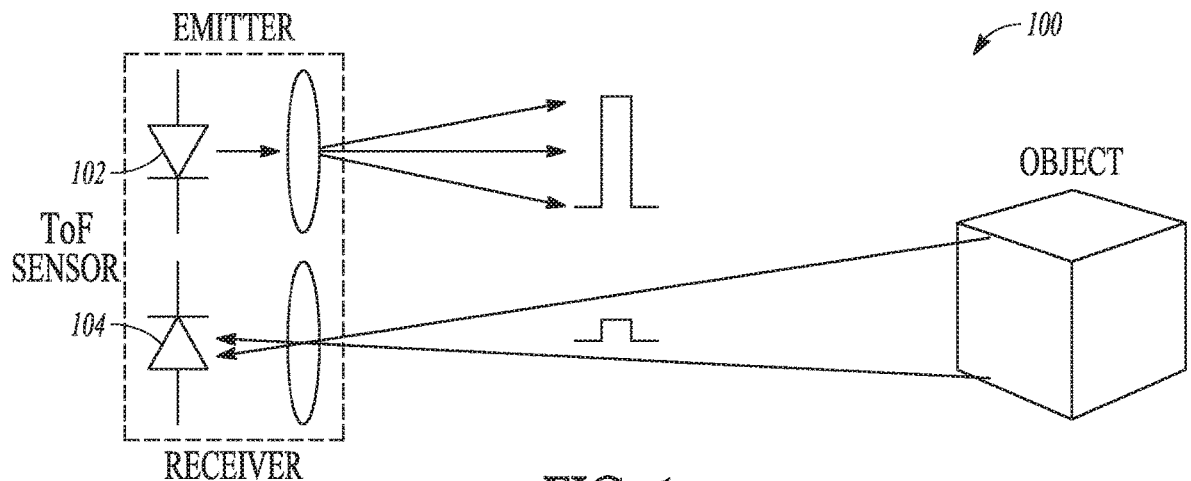
FIG. 1 is an illustration of an example of a time of flight sensor.

FIG. 1 is an illustration of an example of a time-of-flight (ToF) sensor. The ToF sensor 100 includes an emitter and a receiver. The emitter can include a laser diode 102 that converts electrical current to light energy. The receiver can be a photo diode 104 that converts received light energy into electrical current or voltage.

To obtain depth information for imaging, the laser emitter may send a laser pulse to the object and the receiver detects the reflected laser energy. A timer is started when the emitter sends out a light pulse and the timer is stopped when a pulse reflected from an object is received at the ToF sensor. Based on the time it takes for the pulse to do the round trip ($t_{receive} - t_{emit}$) and the speed of light c, the depth information d of the object can be calculated as $$d = \frac{c*(t_{receive}-t_{emit})}{2}.$$

Figure 2:
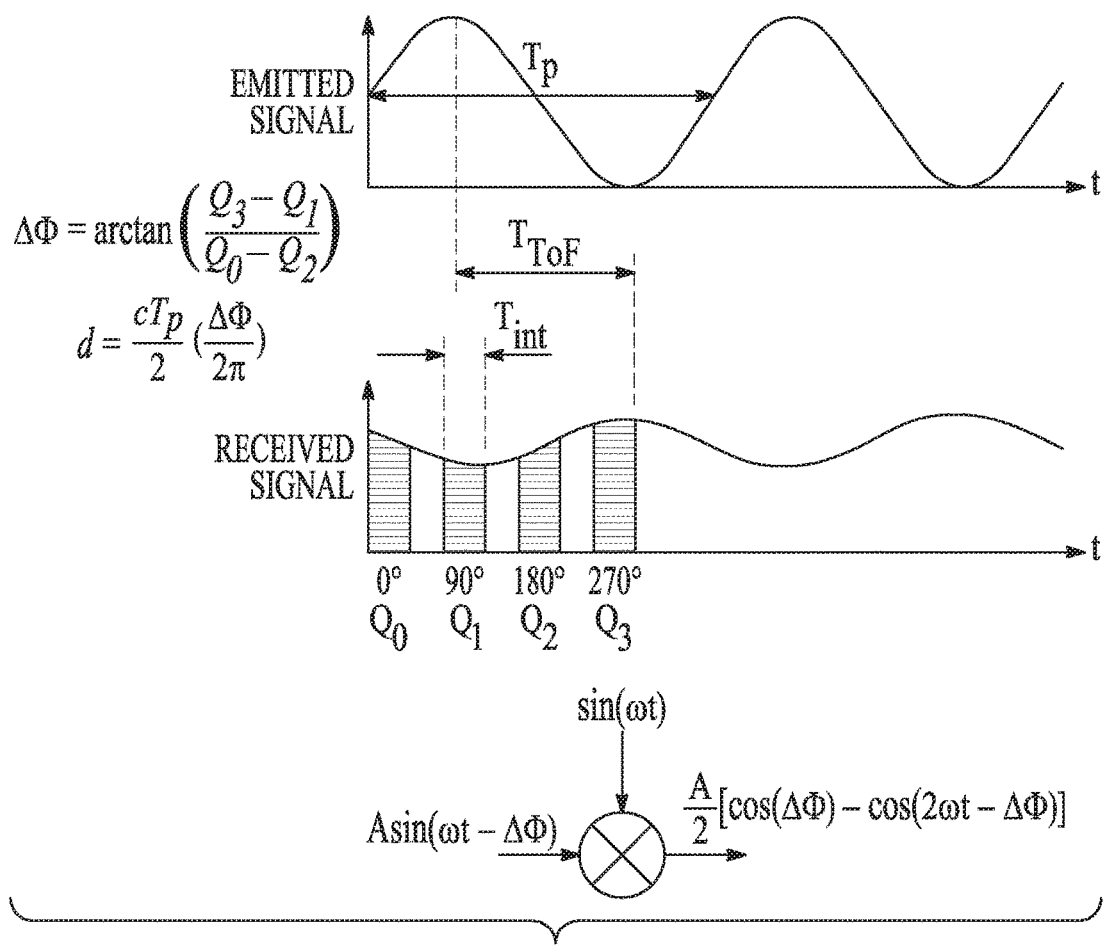
FIG. 2 illustrates operation of a continuous wave indirect time of flight sensor.

FIG. 2 illustrates operation of a continuous wave indirect time of flight sensor (CW I-ToF sensor). For a CW I-ToF sensor, the laser emitter sends out a periodic continuous wave which could be a sine wave or a pulsed wave. The receiver side uses a periodic wave of the same frequency as the emitted wave to demodulate the received wave. The phase delay ΔΦ between the received waveform and the emitted waveform can be obtained as shown in FIG. 2. The depth information d is proportional to the phase delay ΔΦ.

Figure 3A:
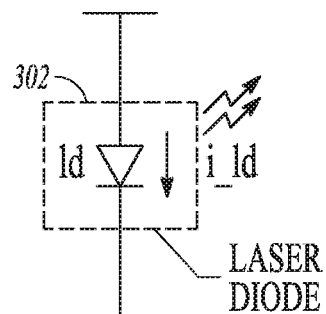
FIG. 3A is a circuit diagram of an example of an emitter for a time of flight sensor.
Figure 3A:
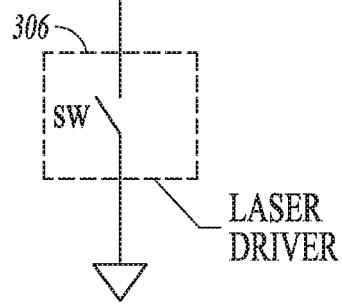
Figure 3B:
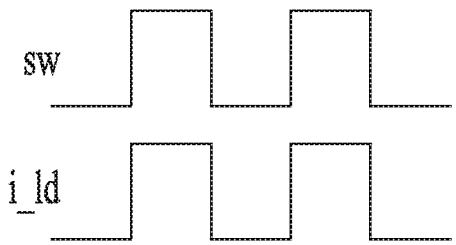
FIG. 3B is an illustration of an example of switching and current waveforms for operation of the time of flight sensor of FIG. 3A.

FIG. 3A is a circuit diagram of an example of an emitter for a ToF sensor, and FIG. 3B is an illustration of an example of switching and current waveforms for operation of the ToF sensor. The emitter includes a laser diode 302 and a laser driver circuit 306. The laser diode 302 may be a vertical cavity surface emitting laser (VCSEL), which is a semiconductor-based laser diode that emits an optical beam vertically from its surface. In a variation, the laser diode 302 may be an edge emitting laser (EEL), which is a semiconductor-based laser diode that emits an optical beam in a direction orthogonal to a side surface of the laser diode.

The laser driver circuit 306 outputs a current pulsed wave that will flow through the laser diode 302 so that optical beams will be emitted by the laser diode 302. In the example of FIG. 3A, the laser driver circuit 306 includes a switch circuit SW, and the laser diode 302 (ld) is the load of the laser driver circuit 306. FIG. 3B shows that the switch SW is turned on and off periodically to cause a pulsed current (i_ld) to flow through the laser diode 302.

Figure 4A:
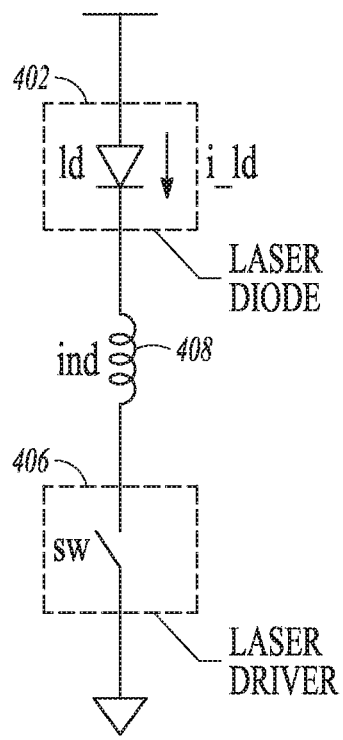
FIG. 4A is a circuit diagram of an example of another emitter for a time of flight sensor.
Figure 4B:
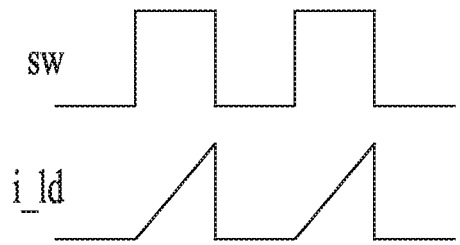
FIG. 4B is an illustration of an example of switching and current waveforms for operation of the time of flight sensor of FIG. 4A.

FIG. 4A is a circuit diagram of another example of an emitter for a ToF sensor. The emitter includes a laser driver circuit 406 with the laser diode 402 load, but the example of FIG. 4A includes a series inductor 408. The inductor may represent the routing parasitic inductance between the die that includes the laser diode 402 and the die that includes the laser driver circuit 406 and may include inductance associated with the laser diode. This parasitic inductance may be of the order of nano-Henrys (nH). FIG. 4B is an illustration of waveforms of operation of the circuit. The operation is similar to the operation shown in FIG. 3B other than the ramp-up rate of the pulsed current i_ld is limited by the inductance.

A challenge in implementing a ToF sensor is the power efficiency of the laser driver. A vast majority of the photons emitted by the laser diode will be dispersed after hitting the object and never get received by the ToF sensor. For this reason, the laser driver needs to have a lot of current flowing through the laser diode to create enough laser energy to be detected by the receiver and the ToF sensor to be effective. The current level needed to flow through the laser diode may be on the order of a few ampere or even tens to hundreds of amperes if longer distance depth imaging is needed. Consequently, the laser driver often dominates the ToF sensor power consumption. Higher power consumption reduces battery life for mobile applications, and severely implicates the heat dissipation issue, especially for applications where space for the ToF sensor is very limited.

For the laser driver circuit 406 shown in FIG. 4A, the average current level is lowered due to the inductor 408 (ind). More importantly, the laser driver circuit 406 is not power efficient because the energy stored in the inductor 408 at the end of the switch on-period is dissipated through heat once the switch SW turns off. The output current level can be improved by pre-charging the inductor, but the penalty of the additional power overhead may double the power consumption.

Figure 5:
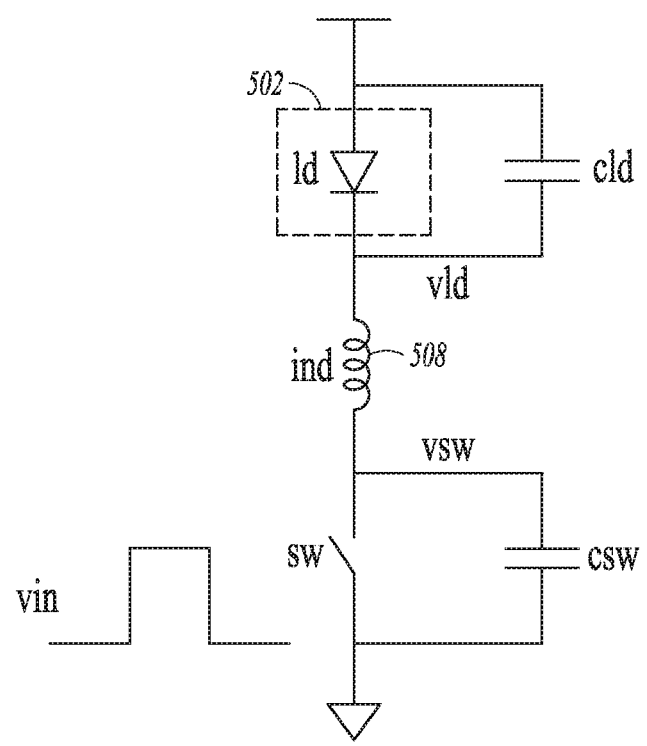
FIG. 5 is a circuit diagram of an example of another emitter for a time of flight sensor.

FIG. 5 is a circuit diagram of another example of an emitter for a ToF sensor. The laser driver circuit for the emitter implements energy recycling to improve power efficiency in driving the laser diode 502. The laser driver circuit includes a capacitor CSW connected across or in parallel to switch circuit SW and a capacitor CLD connected in parallel to the laser diode 502. Capacitors CLD and CSW are also connected in series with the inductor 508.

The capacitors may be fabricated capacitors. In some aspects, one or both of the capacitors in FIG. 5 represents a combination of a fabricated capacitor and a parasitic circuit capacitance. The laser driver circuit may drive more than just one laser diode 502. There may be multiple laser diodes connected in series or parallel. Similarly, the laser driver circuit may have multiple switch circuits or capacitor circuits that connected in parallel or series.

Figure 6A:
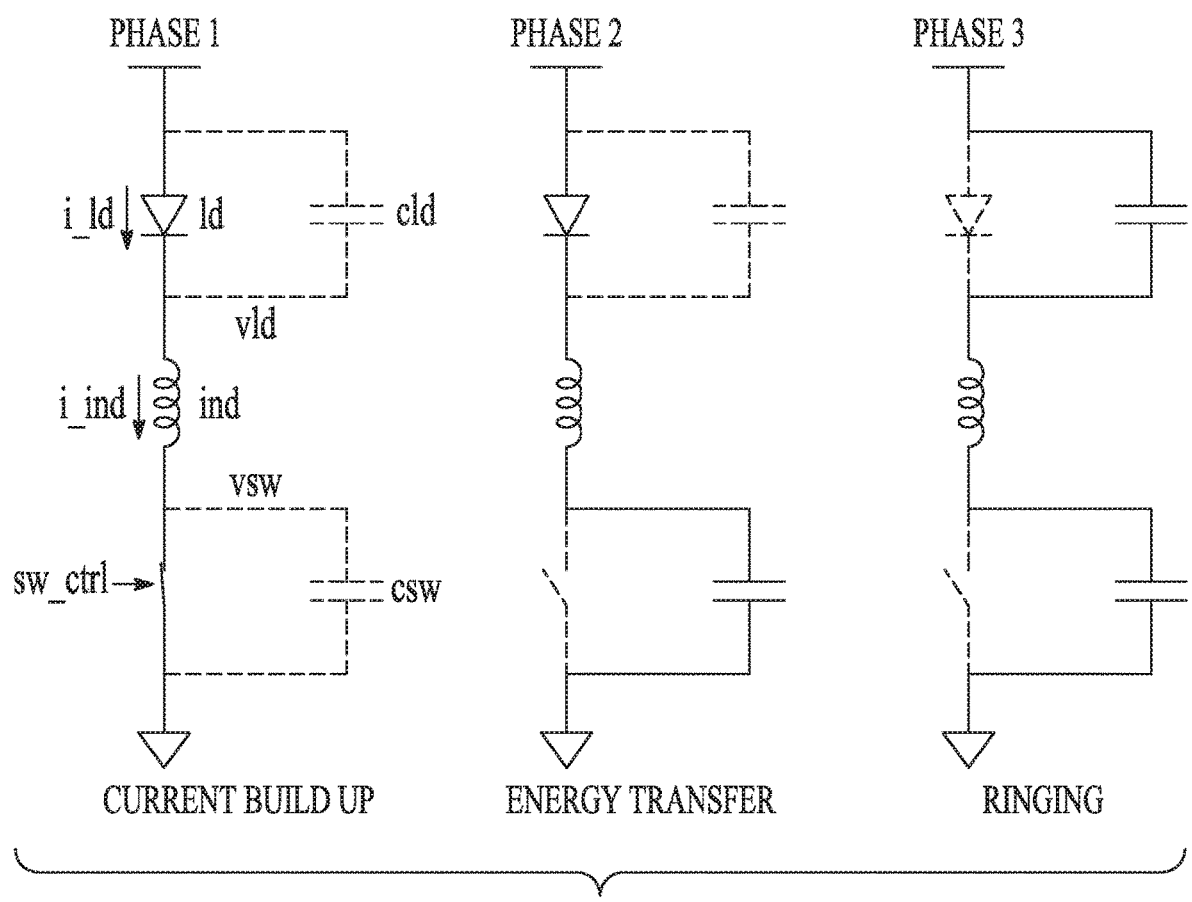
FIG. 6A are illustrations of the three different operating phases of the laser driver circuit of the emitter of FIG. 5.

FIG. 6A are illustrations of the three different operating phases of the laser driver circuit of the emitter of FIG. 5. The phases are determined by the states (on or off) of the switch circuit SW and the laser diode 502. In Phase 1, both the switch circuit SW and the laser diode 502 are on. In Phase 2, the switch circuit SW is off and the laser diode 502 is on. In Phase 3, both the switch circuit SW and the laser diode 502 are off.

Phase 1 is a current build up phase. Because both the switch circuit SW and the laser diode 502 are on, capacitors CSW and CLD are shunted. Current builds up in the inductor 508 according to $$V=L*di/dt \quad (1)$$

$$\Delta i=V/L*Ton, \quad (2)$$

where L is the inductance, i is the inductor current, V is the voltage across the inductors, and Ton is the switch on-time.

Figure 6B:
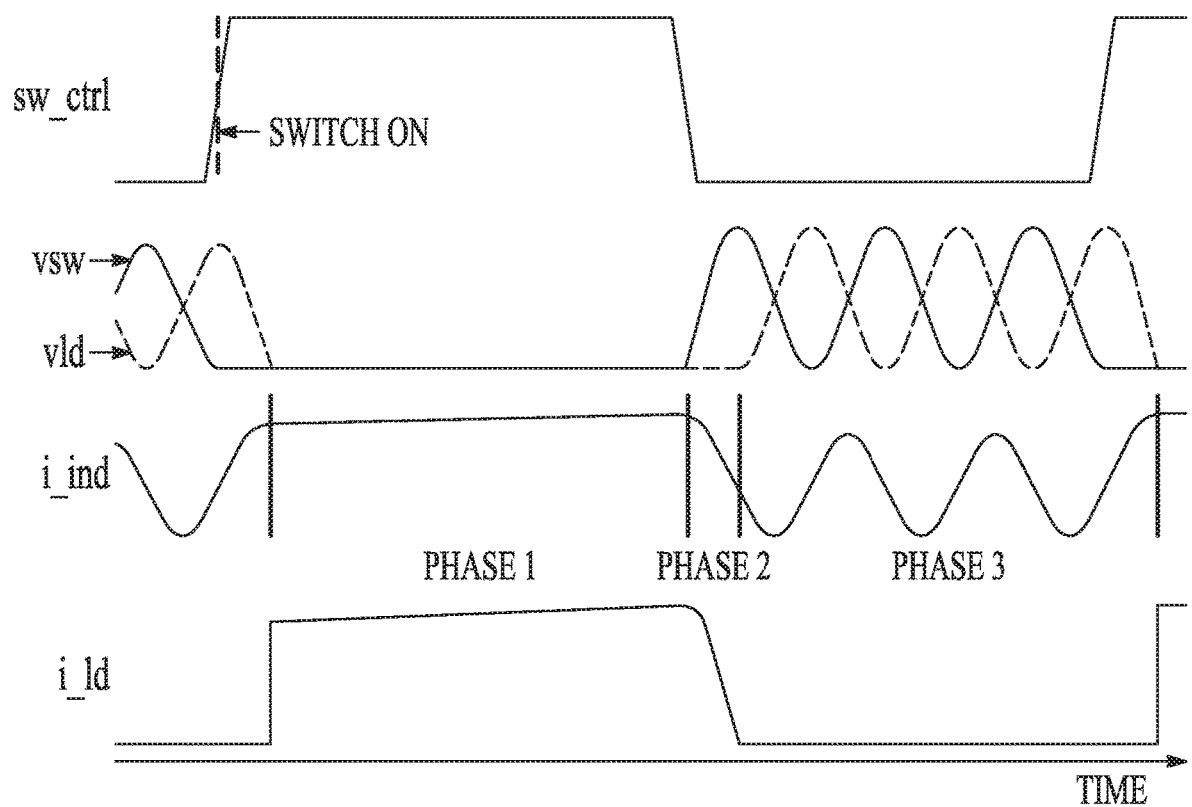
FIG. 6B is an illustration of examples of the switching, voltage, and current waveforms for the operating phases illustrated in FIG. 6A.

FIG. 6B is an illustration of waveforms of the switch circuit control signal (sw_ctrl), the voltage of the switch circuit (Vsw), the voltage of the laser diode (Vld), the inductor current (i_ind), and the laser diode current (i_ld) for the three phases. As shown in FIG. 6B, both the inductor current and the laser diode current increase linearly during Phase 1, building on the initial inductor current level from the previous period.

Phase 2 is an energy transfer phase. Because the switch circuit is turned off but the laser diode is still on, energy stored in the inductor from the previous current build up phase is being transferred to the capacitor across the switch CSW. This can be seen in FIG. 6B as the increase in voltage across the switch Vsw and the decrease in the inductor current i_ind. Once the inductor current goes down to 0, the energy is completely transferred to capacitor CSW. At this instant, the laser diode turns off as its reverse current is negligible, and the circuit enters the next phase.

Phase 3 is the ringing phase. Both the switch circuit and the laser diode are off, and the initial voltage stored on the capacitor CSW from the previous phase causes the series LC circuit (comprising CSW, the inductor, and CLD) to oscillate. The series LC circuit would oscillate without losing any energy if there was no series resistance. When the switch turns on again, the operation goes back to Phase 1 and repeats, without losing energy to heat assuming everything is ideal. The energy of the oscillation is recycled and used to activate the laser diode at the start of the next Phase 1, and there is less ramp-up in the charging of the inductor and less ramp-up in the turning on of the laser diode than in the laser driver circuit example of FIG. 4B.

In practice however, not everything in the circuit is ideal. There will be series parasitic resistance in the connection between the die that includes the laser diode and the die that includes the laser driver circuit, and the switch circuit will also include an on-resistance Ron. The root-mean-square (rms) current flowing through these resistances in any of the three phases directly contributes to energy loss in operation of the laser driver circuit. The laser diode also has non-idealities that contribute to energy loss. Another source of energy loss is the timing of the turn-on of the switch circuit SW during Phase 1.

Figure 7:
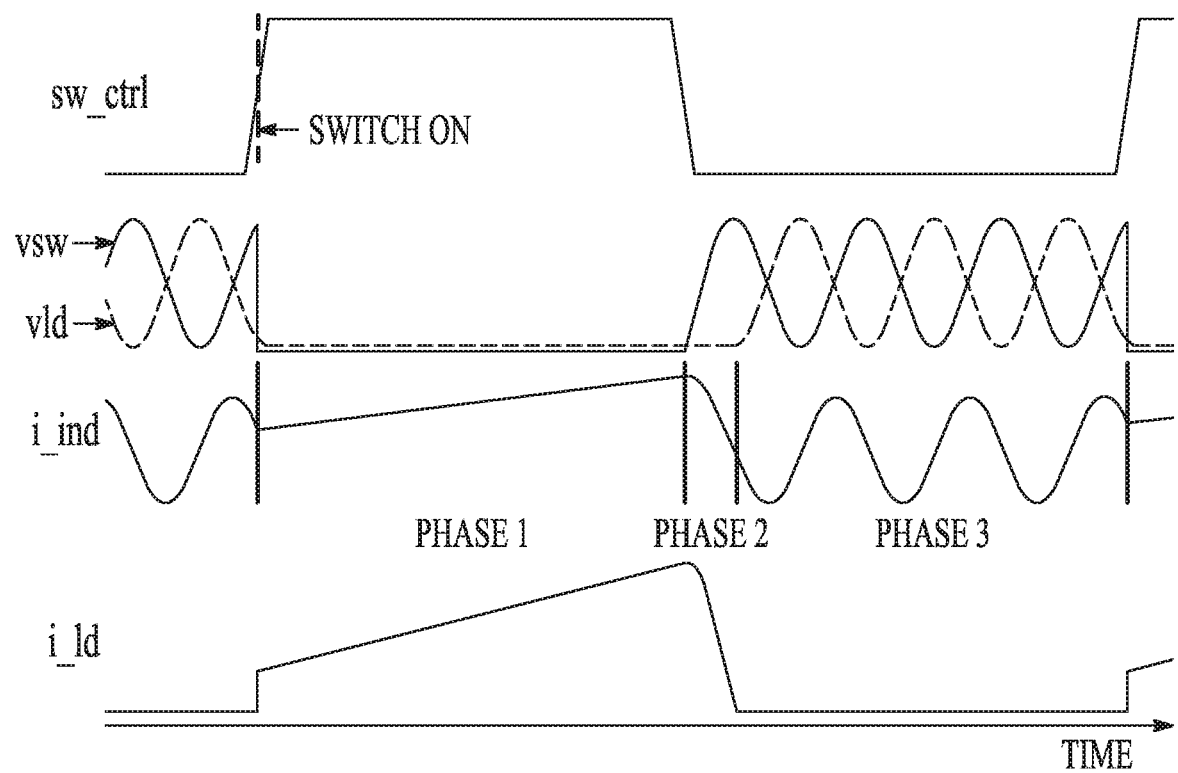
FIG. 7 is an illustration of further examples of the switching, voltage, and current waveforms for the operating phases illustrated in FIG. 6A.

FIG. 7 is an illustration of the waveforms of FIG. 6B, but with the worst-case scenario for the timing of the turning on of the switch circuit SW. The worst energy loss occurs when the switch circuit SW is turned on when the voltage Vsw of capacitor CSW is at a maximum; shown in FIG. 7 as the Switch ON transition occurring during a peak of Vsw. As the switch circuit SW turns on, the capacitor CSW will be shorted, thereby wasting any charge and thus wasting energy stored on the capacitor from the previous phase.

Figure 8:
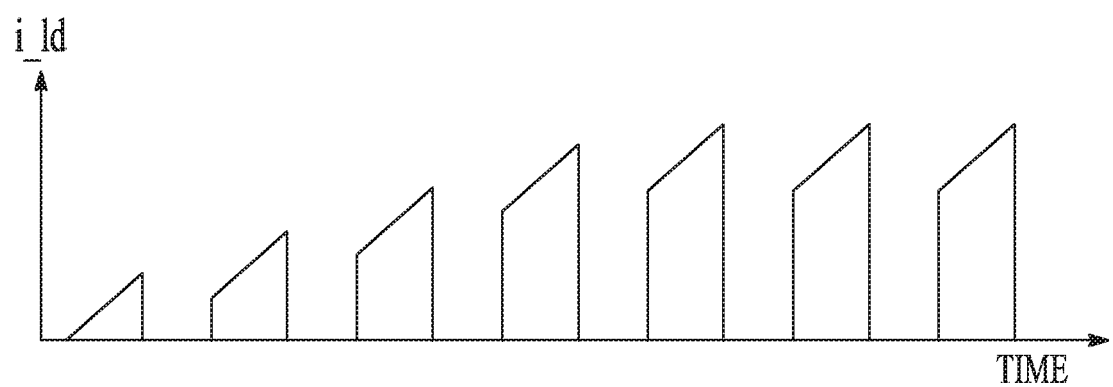
FIG. 8 is an illustration of an example of a current waveform for operation of the laser driver circuit of the emitter of FIG. 5.

FIG. 8 is an illustration of an example of the buildup of laser diode current through multiple cycles of the three operating phases of the laser driver circuit of the emitter of FIG. 5. The duty cycling of the switch circuit by the on-period of Phase 1 and the off-period of Phase 3 stores the energy used to activate the laser diode is stored in the LC tank circuit of the laser driver circuit. The stored energy is recycled for use in a subsequent activation of the laser diode. Due to the non-idealities of the circuit, the laser diode current i_ld will not keep increasing indefinitely. FIG. 8 illustrates that the laser diode current will eventually saturate once the total energy loss in all three phases combined is equal to the energy gain from the circuit supply during Phase 1.

Mitigating the energy loss due to the non-ideal resistances of the emitter involves minimizing the parasitic resistance of the laser driver circuit and Ron of the switch circuit SW. For a continuous wave (e.g., sine wave) laser driver, the switch off time is roughly 50% of the switching period, which is typically on the order of a few nanoseconds to low tens of nanoseconds. The energy loss or ringing decay during Phase 2 and Phase 3 is usually minimal, preserving most of the energy built up from Phase 1. However, for a pulsed wave laser driver where the duty cycle tends to be very small, the energy recycling could be less effective because the switch off time may be much longer. In this case, the ringing would likely have significant decay before the next switch turn-on time.

Figures 9, 10:
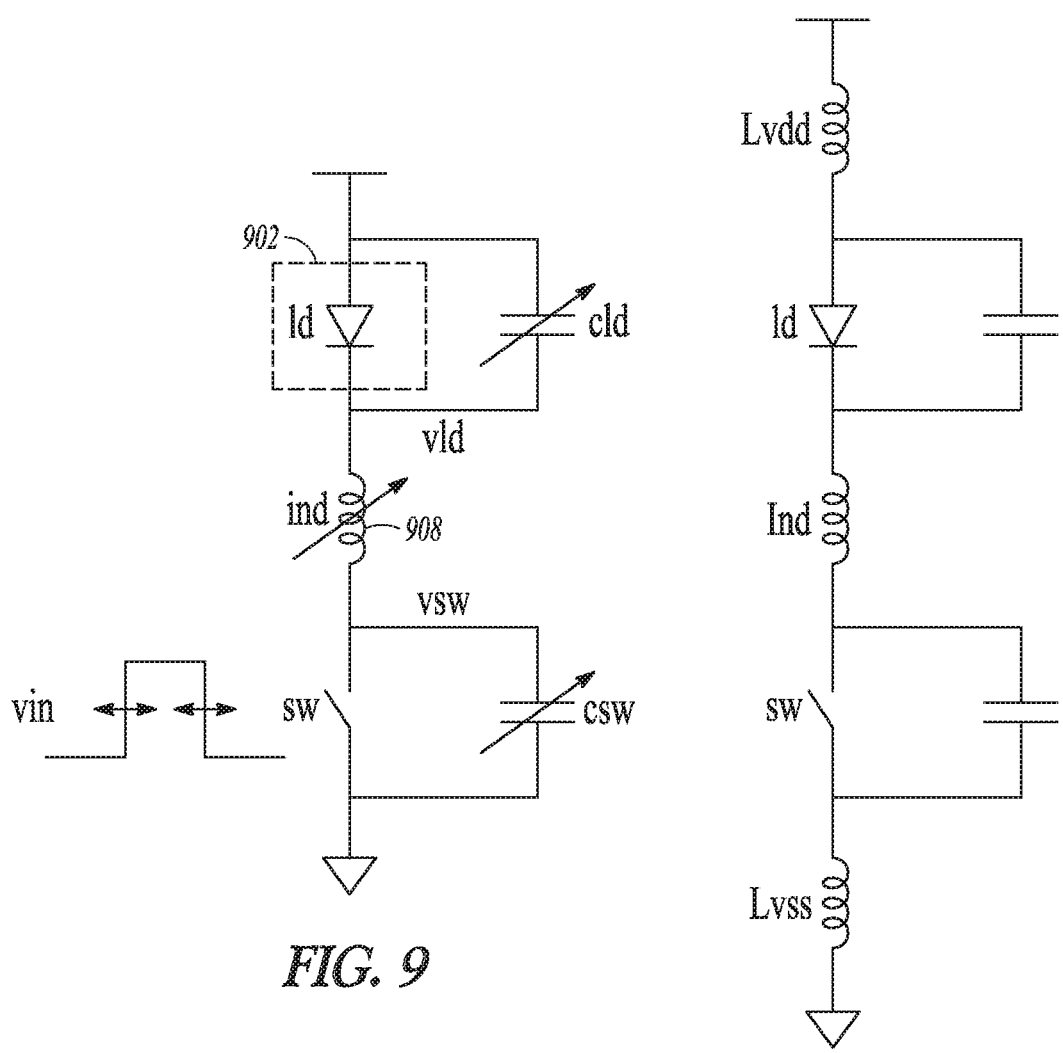
FIG. 9 is a circuit diagram of another example of an emitter for a time of flight sensor.
FIG. 10 is a circuit diagram of a further example of an emitter for a time of flight sensor.

FIG. 9 is a circuit diagram of another example of an emitter for a ToF sensor to illustrate mitigation of the energy loss due to the timing of the switching. The capacitors CLD and CSW are adjustable or tunable. To mitigate the switching loss due to finite voltage across CSW when the switch is turned on, the capacitance of either or both of the capacitors can be adjusted to change the ringing period during phase 3 so that the voltage drop across capacitor CSW is minimized at the turn on time of the switch circuit.

As shown in FIG. 9, the inductor 908 may be tunable. The inductor in FIG. 9 may represent a combination of a parasitic circuit inductance and a fabricated inductor. The inductance of the circuit may be adjusted so that the voltage drop across capacitor CSW is minimized at the turn on time of the switch circuit SW.

Also, the timing of the control signal (sw_ctrl in FIGS. 6B and 7) that controls the switch circuit SW may be adjustable.

As shown in FIG. 9, either the rising or falling timing of the switch control signal can be adjusted while maintaining the switching period so that the available ringing time in phase 3 changes. This allows the time of switch turn-on of the switch circuit to be move to when the voltage drop across capacitor CSW is minimized. Thus, either or both of the time of minimum of Vsw and the time of turn on of switch circuit SW can be moved so that the voltage is minimized at the time of the turn on of the switch circuit SW. The smaller the voltage drop over CSW when the switch turns on, the more energy is being recycled in this laser driver, thereby improving the overall laser driver power efficiency of the laser driver circuit.

The example of FIG. 9 shows the switch circuit SW located on the bottom side of the laser diode 902. In variations, the switch circuit could be located on the top side of the laser diode between the supply and the inductor. The laser diode would be connected between the inductor and circuit ground.

FIG. 10 is a circuit diagram of another example of an emitter for a ToF sensor. In addition to the inductive element IND in the examples of FIGS. 5 and 9, the example of FIG. 10 shows a second inductive circuit element Lvdd associated with a higher voltage supply rail of the laser diode driver circuit and a third inductive circuit element Lgnd associated with a lower voltage supply rail or ground of the laser diode driver circuit. The operation of the laser driver circuit is the same as described in regard to FIGS. 6B, 7 and 8.

Figure 11:
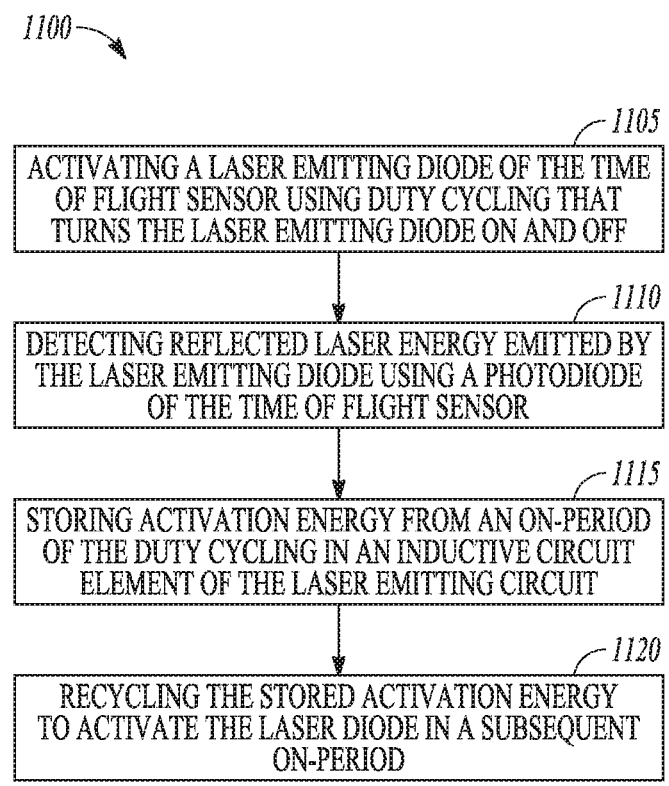
FIG. 11 is a flow diagram of an example of a method of operating a time of flight sensor.

FIG. 11 is a flow diagram of an example of a method of operating a ToF sensor. At 1105, a laser emitting diode of the time of flight sensor is activated using duty cycling that turns the laser emitting diode on and off. The activation may cause the laser diode to emit a periodic continuous pulsed wave of laser energy.

At 1110, reflected laser energy emitted by the laser emitting diode is detected using a photodiode of the time of flight sensor. The ToF sensor may be included in an assembly that includes a lens to focus the received reflected energy onto the photodiode or an array of photodiodes.

At 1115, activation energy from an on-period of the duty cycling is stored in an inductive circuit element of the laser emitting circuit. The inductive circuit element may be a parasitic circuit inductance, a fabricated circuit inductor, or a combination of parasitic and fabricated inductance.

At 1120, the activation energy stored in the inductive circuit element is recycled to activate the laser diode in a subsequent on-period of the duty cycling. One or more capacitive circuit elements may be used in combination with the inductive circuit element to form an inductive-capacitive (LC) tank circuit to recycle the energy by cycling the energy between the inductive circuit element and the one or more capacitive circuit elements, or ringing. The detected reflected laser energy is used to determine a distance to an object, such as by the method described herein in regard to FIG. 2.

The circuits and methods described herein improve the power efficiency of laser driver circuit because the energy stored in the inductor at the end of the switch on-period is not dissipated once the switch turns off. Instead the energy is recycled using the LC circuit to drive the laser diode during subsequent cycles.

ADDITIONAL DESCRIPTION AND ASPECTS

Aspect 1 includes subject matter (such as a laser pulse emitter circuit) comprising a laser diode and a laser diode driver circuit. The laser diode driver circuit includes an inductive circuit element arranged in series with the laser diode, at least one capacitive circuit element arranged in series with the inductive circuit element, and a switch circuit configured to activate the laser diode using duty cycling that includes an on-period and an off-period. Energy used in an activation of the laser diode includes energy stored in the inductive circuit element and the at least one capacitive circuit element, and the stored energy is recycled by use in a subsequent activation of the laser diode.

In Aspect 2, the subject matter of Aspect 1 optionally includes a capacitor circuit including a first capacitive circuit element connected in series with the inductive circuit element and connected in parallel with the laser diode, and a second capacitive circuit element arranged in series with the inductive circuit element and arranged in parallel with the switch circuit.

In Aspect 3, the subject matter of Aspect 2 optionally includes the first capacitive circuit element and the second capacitive circuit element are each a combination of a fabricated capacitor and a parasitic circuit capacitance.

In Aspect 4, the subject matter of one or both of Aspects 2 and 3 optionally include a capacitance of at least one of the first capacitive circuit element and the second capacitive circuit element is adjustable to minimize a voltage of the second capacitive circuit element at a turn on time of the switch circuit.

In Aspect 5, the subject matter of one or any combination of Aspects 2-4 optionally includes a switch control circuit configured to provide an adjustable switch control signal to turn on and turn off the switch circuit, wherein at least one of a turn on time or a turn off time of the switch control signal is adjustable to minimize a voltage of the second capacitive circuit element at the turn on time of the switch circuit.

In Aspect 6, the subject matter of one or any combination of Aspects 2-5 optionally includes an inductance of the inductive circuit element of the laser diode driver circuit being adjustable to minimize a voltage of the second capacitive circuit element at a turn on time of the switch circuit.

In Aspect 7, the subject matter of one or any combination of Aspects 1-6 optionally includes the inductive circuit element of the laser diode driver circuit being a parasitic circuit inductance.

In Aspect 8, the subject matter of one or any combination of Aspects 1-7 optionally includes a laser diode driver circuit having a second inductive circuit element associated with a higher voltage supply rail of the laser diode driver circuit and a third inductive circuit element associated with a lower voltage supply rail of the laser diode driver circuit.

In Aspect 9, the subject matter of one or any combination of Aspects 1-8 optionally includes a laser diode that is a vertical cavity surface emitting laser diode.

In Aspect 10, the subject matter of one or any combination of Aspects 1-9 optionally includes a laser diode that is an edge emitting laser diode.

Aspect 11 can include subject matter (such as a time of flight sensor circuit) or can optionally be combined with one or any combination of Aspects 1-10 to include such subject matter, comprising an emitter circuit and a receiver circuit. The emitter circuit includes a laser diode and a laser diode driver circuit. The laser diode driver circuit includes an inductive circuit element in series with the laser diode and a switch circuit connected in series with the inductive circuit element and configured to activate the laser diode using duty cycling that includes an on-period and an off-period. Energy used in an activation of the laser diode includes energy stored in the inductive circuit element, and the stored energy is used in a subsequent activation of the laser diode. The receiver circuit includes a photodiode configured to receive laser energy emitted by the laser diode and reflected back toward the time of flight sensor circuit.

In Aspect 12, the subject matter of Aspect 11 optionally includes a laser driver circuit that includes a first capacitive circuit element connected in series with the inductive circuit element and connected in parallel with the laser diode, and a second capacitive circuit element connected in series with the inductive circuit element and connected in parallel with the switch circuit. The energy used in the activation of the laser diode includes energy stored in the inductive circuit element and the first and second capacitive circuit elements.

In Aspect 13, the subject matter of Aspect 12 optionally includes a capacitance of at least one of the first capacitive circuit element and the second capacitive circuit element being adjustable to minimize a voltage of the second capacitive circuit element when the switch circuit is turned on.

In Aspect 14, the subject matter of one or both of Aspects 12 and 13 optionally includes a switch control circuit configured to provide an adjustable switch control signal to turn on and turn off the switch circuit, wherein at least one of a turn on time or a turn off time of the switch control signal is adjustable to minimize a voltage of the second capacitive circuit element when the switch circuit is turned on.

In Aspect 15, the subject matter of one or any combination of Aspects 12-14 optionally includes the inductance of the inductive circuit element of the laser diode driver circuit being adjustable to minimize a voltage of the second capacitive circuit element when the switch circuit is turned on.

In Aspect 16, the subject matter of one or any combination of Aspects 12-15 optionally includes the first capacitive circuit element and the second capacitive circuit element each being a combination of a fabricated capacitor and a parasitic circuit capacitance.

In Aspect 17, the subject matter of one or any combination of Aspects 11-16 optionally includes the inductive circuit element of the laser diode driver circuit being a parasitic circuit inductance of the time of flight sensor circuit.

In Aspect 18, the subject matter of one or any combination of Aspects 11-17 optionally includes a laser diode driver circuit including a second inductive circuit element associated with a higher voltage supply rail of the laser diode driver circuit and a third inductive circuit element associated with a lower voltage supply rail of the laser diode driver circuit.

Aspect 19 can include subject matter (such as method of operating a time of flight sensor) or can optionally be combined with one or any combination of Aspects 1-18 to include such subject matter, comprising activating a laser emitting diode of the time of flight sensor using duty cycling that turns the laser emitting diode on and off; detecting reflected laser energy emitted by the laser emitting diode using a photodiode of the time of flight sensor; storing activation energy from an on-period of the duty cycling in an inductive circuit element of the laser emitting circuit; and recycling the stored activation energy to activate the laser diode in a subsequent on-period.

In Aspect 20, the subject matter of Aspect 19 optionally includes activating the laser emitting diode using a switch circuit, and storing activation energy from the on-period of the duty cycling using the inductive circuit element, a first capacitive circuit element connected in series with the inductive circuit element and connected in parallel with the laser emitting diode, and a second capacitive circuit element connected in series with the inductive circuit element and connected in parallel with the switch circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A laser pulse emitter circuit comprising:
    a laser diode;
    a laser diode driver circuit including:
        an inductive circuit element arranged in series with the laser diode;
        a switch circuit;
        a first capacitive circuit element arranged in series with the inductive circuit element and arranged in parallel with the laser diode;
        a second capacitive circuit element arranged in series with the inductive circuit element and arranged in parallel with the switch circuit; and
    wherein the switch circuit is configured to activate the laser diode using duty cycling that includes an on-period and an off-period that includes an energy transfer phase and a ringing phase, wherein energy used in an activation of the laser diode includes energy stored in the inductive circuit element during the on-period, energy transferred to the first capacitive circuit element and charge on the second capacitive element minimized during the energy transfer phase, and energy stored in the inductive circuit element and first and second capacitive circuit elements of the ringing phase recycled by use in a subsequent activation of the laser diode, wherein the subsequent activation of the laser diode begins when energy is still oscillating in the inductive circuit element and first and second capacitive circuit elements and a voltage across the second capacitive element is minimized.

2. The laser pulse emitter circuit of claim 1, wherein the first capacitive circuit element and the second capacitive circuit element are each a combination of a fabricated capacitor and a parasitic circuit capacitance.

3. The laser pulse emitter circuit of claim 1, wherein a capacitance of at least one of the first capacitive circuit element and the second capacitive circuit element is adjustable to minimize the voltage of the second capacitive circuit element at a turn on time of the switch circuit.

4. The laser pulse emitter circuit of claim 1, including a switch control circuit configured to provide an adjustable switch control signal to turn on and turn off the switch circuit, wherein at least one of a turn on time or a turn off time of the switch control signal is adjustable to minimize the voltage of the second capacitive circuit element at the turn on time of the switch circuit.

5. The laser pulse emitter circuit of claim 1, wherein an inductance of the inductive circuit element of the laser diode driver circuit is adjustable to minimize the voltage of the second capacitive circuit element at a turn on time of the switch circuit.

6. The laser pulse emitter circuit of claim 1, wherein the inductive circuit element of the laser diode driver circuit is a parasitic circuit inductance.

7. The laser pulse emitter circuit of claim 1, wherein the laser diode driver circuit includes a second inductive circuit element associated with a higher voltage supply rail of the laser diode driver circuit and a third inductive circuit element associated with a lower voltage supply rail of the laser diode driver circuit.

8. The laser pulse emitter circuit of claim 1, wherein the laser diode is a vertical cavity surface emitting laser diode.

9. The laser pulse emitter circuit of claim 1, wherein the laser diode is an edge emitting laser diode.

10. A time of flight sensor circuit comprising:
    an emitter circuit including:
        a laser diode; and
        a laser diode driver circuit including:
            an inductive circuit element arranged in series with the laser diode;
            a switch circuit arranged in series with the inductive circuit element;
            a first capacitive circuit element arranged in series with the inductive circuit element and arranged in parallel with the laser diode; and a second capacitive circuit element arranged in series with the inductive circuit element and arranged in parallel with the switch circuit;

wherein the switch circuit is configured to activate the laser diode using duty cycling that includes an on-period and an off-period that includes an energy transfer phase and a ringing phase, wherein energy used in an activation of the laser diode includes energy stored in the inductive circuit element, and the stored energy is transferred to the second capacitive element during the energy transfer phase, and the stored energy of the ringing phase is used in a subsequent activation of the laser diode, wherein the subsequent activation of the laser diode begins when energy is still oscillating in the inductive circuit element and first and second capacitive circuit elements and a voltage across the second capacitive element is minimized; and a receiver circuit including a photodiode configured to receive laser energy emitted by the laser diode and reflected back toward the time of flight sensor circuit.

11. The time of flight sensor circuit of claim 10, wherein a capacitance of at least one of the first capacitive circuit element and the second capacitive circuit element is adjustable to minimize the voltage of the second capacitive circuit element when the switch circuit is turned on.

12. The time of flight sensor circuit of claim 10, including a switch control circuit configured to provide an adjustable switch control signal to turn on and turn off the switch circuit, wherein at least one of a turn on time or a turn off time of the switch control signal is adjustable to minimize the voltage of the second capacitive circuit element when the switch circuit is turned on.

13. The time of flight sensor circuit of claim 10, wherein an inductance of the inductive circuit element of the laser diode driver circuit is adjustable to minimize the voltage of the second capacitive circuit element when the switch circuit is turned on.

14. The time of flight sensor circuit of claim 10, wherein the first capacitive circuit element and the second capacitive circuit element are each a combination of a fabricated capacitor and a parasitic circuit capacitance.

15. The time of flight sensor circuit of claim 10, wherein the inductive circuit element of the laser diode driver circuit includes a parasitic circuit inductance.

16. The time of flight sensor circuit of claim 10, wherein the laser diode driver circuit includes a second inductive circuit element associated with a higher voltage supply rail of the laser diode driver circuit and a third inductive circuit element associated with a lower voltage supply rail of the laser diode driver circuit.

17. A method of operating a time of flight sensor, the method comprising:
  activating a laser emitting diode of a laser emitting circuit of the time of flight sensor using duty cycling of a switch circuit to turn the laser emitting diode on and off;
  detecting reflected laser energy emitted by the laser emitting diode using a photodiode of the time of flight sensor;
  storing activation energy from an on-period of the duty cycling in an inductive circuit element of the laser emitting circuit;
  charging a first capacitive circuit element of the laser emitting circuit during an off-period energy transfer phase;
  storing energy from an off-period ringing phase of the duty cycling in the inductive circuit element, the first capacitive circuit element, and a second capacitive circuit element of the laser emitting circuit; and
  recycling the stored activation energy to activate the laser diode in a subsequent on-period, wherein the subsequent on-period begins when energy is still oscillating in the inductive circuit element and first and second capacitive circuit elements and a voltage across the switch circuit is minimized.

18. The method of claim 17,
wherein activating the laser emitting diode includes activating the laser emitting diode using a switch circuit; and
wherein storing activation energy includes storing activation energy from the on-period of the duty cycling using the inductive circuit element, the first capacitive circuit element connected in series with the inductive circuit element and connected in parallel with the laser emitting diode to a circuit node between the inductive circuit element and a cathode of the laser emitting, and the second capacitive circuit element connected in series with the inductive circuit element and connected in parallel with the switch circuit.

* * * * *